United States Patent [19]

Robertson, Jr. et al.

[11] 4,429,287
[45] Jan. 31, 1984

[54] COAXIALLY COUPLED TUNABLE OSCILLATOR USING A RIDGE WAVEGUIDE

[75] Inventors: Ralston S. Robertson, Jr., Reseda; Robert L. Eisenhart, Woodland Hills, both of Calif.

[73] Assignee: Hughes Aircraft Company, El Segundo, Calif.

[21] Appl. No.: 272,808

[22] Filed: Jun. 11, 1981

[51] Int. Cl.³ .............................................. H03B 7/14
[52] U.S. Cl. .............................. 331/107 DP; 331/101
[58] Field of Search ..................... 331/96, 101, 107 R, 331/107 DP, 107 G, 107 C

[56] References Cited

U.S. PATENT DOCUMENTS

| | | | |
|---|---|---|---|
| 3,711,792 | 1/1973 | Kaneko et al. | 331/107 G X |
| 3,878,480 | 4/1975 | Hulderman et al. | 331/107 DP X |
| 3,895,314 | 7/1975 | Sekine et al. | 331/101 X |
| 4,162,458 | 7/1979 | Dydyk et al. | 331/107 G X |

OTHER PUBLICATIONS

"A Single-Tuned Oscillator for IMPATT Characterizations", Proceedings of the IEEE, May 1970, pp. 831-832.

Primary Examiner—Siegfried H. Grimm
Assistant Examiner—Edward P. Westin
Attorney, Agent, or Firm—Anthony W. Karambelas; Lawrence V. Link, Jr.; Charles D. Brown

[57] ABSTRACT

A source of microwave-frequency electromagnetic energy of a specific desired frequency is generated by a device that utilizes a filter network to absorb energy of unwanted frequencies and couples energy of the desired frequency into a tunable ridge waveguide. The filter network is designed into the DC bias conductor to increase oscillator efficiency.

8 Claims, 3 Drawing Figures

COAXIALLY COUPLED TUNABLE OSCILLATOR USING A RIDGE WAVEGUIDE

TECHNICAL FIELD

This invention relates to the field of microwave oscillator circuits which are used as a source of electromagnetic energy having a particular desired frequency.

BACKGROUND OF THE INVENTION

1. Field of the Invention

Many different systems have a need for a source of microwave power having a certain frequency. Microwave sources employing negative-resistance diodes, filter circuits, and impedance matching circuits have been used as sources of microwave power due to their relative simplicity, small size and light weight. The invention relates to such a microwave power source.

2. Description of the Prior Art

Oscillator circuits employing two-terminal negative-resistance devices have been known for many years. IMPATT, TRAPATT, BARITT, and GUNN diodes are some of the negative-resistance devices used in oscillator circuits. These oscillator circuits have more recently been used in power combiners, where the power outputs of several oscillator circuits are combined to yield power levels higher than is obtainable from any one oscillator circuit.

A negative-resistance oscillator basically comprises a negative-resistance device connected through a resonator, tuned to the desired frequency, to a load having a positive resistance. The device impedance is equal to the negative of the transformed load impedance. To achieve optimum operational efficiency, an impedance-matching network is usually incorporated into the oscillator circuit.

Prior art oscillator circuits have used negative-resistance devices to feed oscillatory electromagnetic energy to a load. Typically, these circuits disposed the negative-resistance device at one end of a coaxial transmission line and disposed a dissipative impedance at the other end of the coaxial transmission line. A coupling circuit located between the negative-resistance device and the dissipative load coupled energy of the desired frequency to a resonant cavity. The energy was then coupled to an output transmission line and fed to an appropriate load.

These prior art oscillator circuits had certain disadvantages, including those related to the use of a waveguide short in combination with a coupling iris as the tuning mechanism. In this arrangement, the oscillatory energy was coupled to a resonant cavity or a standard rectangular waveguide. As a result, such prior art oscillator circuits suffered from narrow tuning ranges, narrow instantaneous injection bandwidths, and relatively low circuit efficiency.

SUMMARY OF THE INVENTION

It is a purpose of this invention to provide a new and improved oscillator of the type described which overcomes most, if not all, the above-identified disadvantages of prior art oscillator circuits and which is operable to efficiently supply electromagnetic energy of a desired frequency to a load.

It is further a purpose of this invention to provide an oscillator circuit having a relatively high efficiency.

It is also a purpose of this invention to provide an oscillator circuit that is tunable over a relatively wide frequency range.

It is further a purpose of this invention to provide a broad injection locked bandwidth oscillator circuit.

The above purposes and advantages are accomplished in accordance with the present invention by the provision of a source of oscillating electromagnetic energy comprising a first coaxial transmission line having a negative-resistance device disposed at one end, and which is electrically connected between the inner and outer conductors of the first transmission line. A filter network is disposed at the other end of the first transmission line and comprises both a dissipative impedance and a means for reflecting energy of a desired frequency and for transmitting all other energy to the dissipative impedance. A ridge waveguide is electromagnetically coupled to the first coaxial transmission line at a first coupling point between the negative-resistance device and the filter network. Oscillatory power propagating from the negative-resistance device along the first transmission line encounters the filter network, where energy of the desired frequency is reflected and all other energy is passed to the dissipative impedance. The energy from the diode is coupled to the ridge waveguide. A first tuning short on one side of the first transmission line causes all of the coupled energy to propagate to a point where a second coaxial transmission line is coupled to the ridge waveguide. A second tuning short on the opposite side of the ridge waveguide from the first transmission line causes the energy propagating through the ridge waveguide to be coupled to the second transmission line. The second transmission line feeds the coupled energy to a load.

One advantage of the invention is that the frequency of the energy transmitted to the load can be tuned over a relatively wide range, for a single impedance matching network in the first transmission line, because tuning is accomplished by the tuning shorts. Another advantage of the invention is that the oscillator displays a broad instantaneous locking bandwidth. This locking bandwidth performance coupled with a wide mechanical tuning range gives the invention the advantage of eliminating most of the custom-tailoring usually necessary with oscillator circuits. This is especially advantageous in high-volume manufacturing. A further advantage of the invention is that the efficiency of the circuit is relatively high, because of the RF filter network disposed on the one end of the first transmission line.

DETAILED DESCRIPTION OF THE INVENTION

Figure 1:
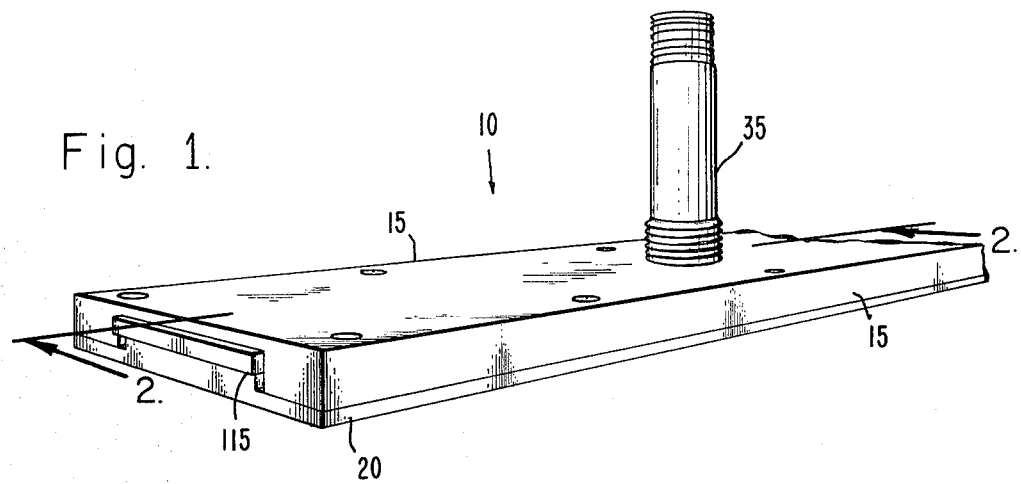
FIG. 1 is a perspective view of one embodiment of the invention.
Figure 2:
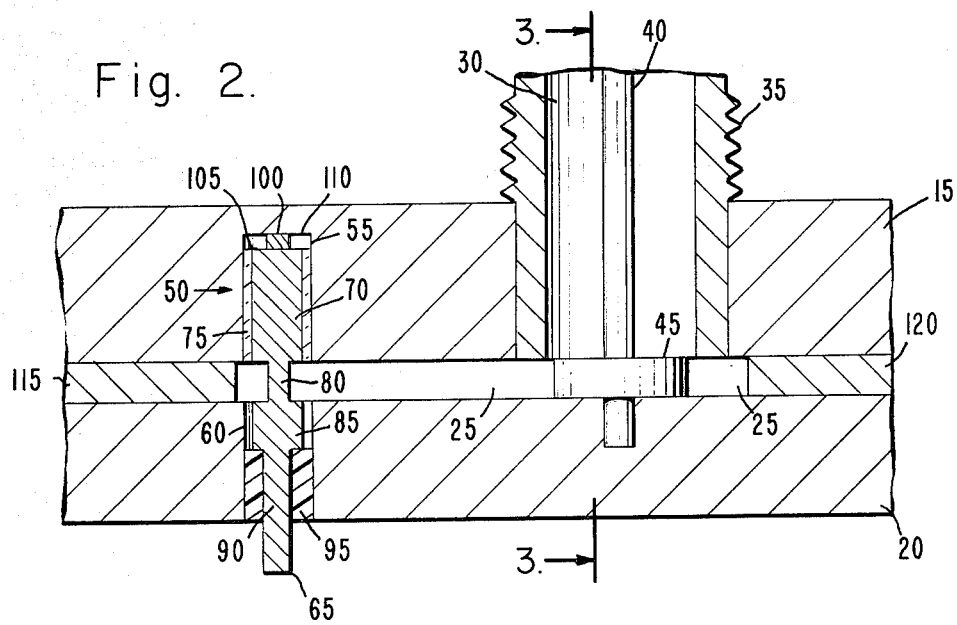
FIG. 2 is a cross-sectional view of this embodiment taken along line 2—2 of FIG. 1.
Figure 3:
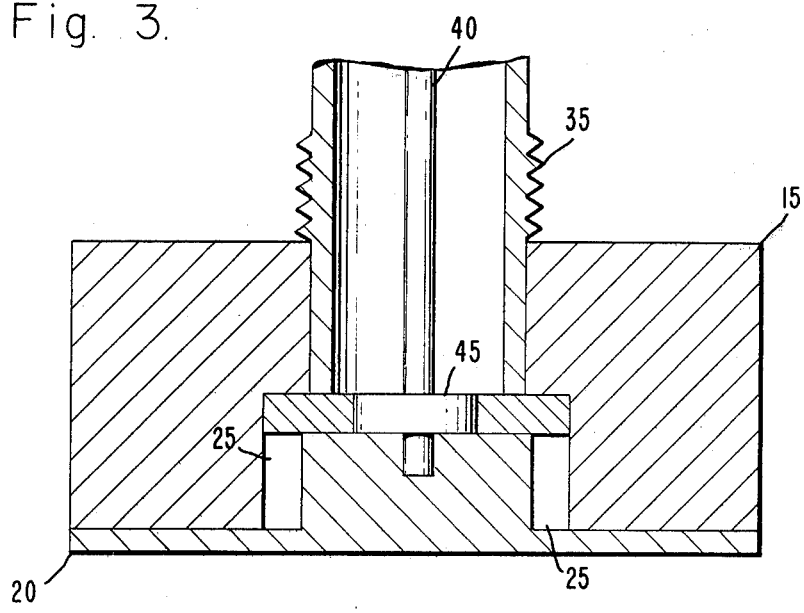
FIG. 3 is a cross-sectional view of this embodiment taken along line 3—3 of FIG. 1.

In FIG. 1, there is shown a ridged waveguide (ridgeguide) 10 comprising a top portion 15 and a bottom portion 20. The ridgeguide is constructed so that it forms a cavity 25 extending the length of the ridgeguide 10 as shown in FIG. 2. The cross-sectional shape of the cavity 25 is shown in FIG. 3. Ridgeguides of this type are known in the microwave arts.

The ridgeguide cavity 25 is coupled to a microwave output port 30. The output port 30 is a coaxial transmission line comprising an outer conductor 35 and an inner conductor 40. The inner conductor 40 is connected at one end to a cylindrical impedance-matching step 45. This impedance-matching step 45 is a short cylinder having a diameter less than the inside diameter of the outer conductor 35 and a height equal to the height of the ridgeguide cavity 25. The inner conductor 40 and the impedance-matching step 45 are coaxial.

The ridgeguide cavity 25 is also coupled to a coaxial oscillator circuit 50 extending through the bottom portion 20, and partially into the top portion 15 of the ridgeguide 10. A cylindrical cavity 55 extends partially through ridgeguide top portion 15, and a cylindrical hole 60 extends through ridgeguide bottom portion 20. The holes 55 and 60 are coaxial. A conductive rod 65 is coaxially inserted into the holes 55 and 60. The rod 65 has four segments, each segment having a different diameter. The first segment 70 of the rod 65 lies entirely within the hole 55, and has a diameter smaller than that of the hole 55. The rod segment 70 is jacketed by an annular layer of dielectric material 75, such as well-known materials sold under the tradenames REXOLITE or TEFLON. This dielectric jacket 75 has an outside diameter equal to the diameter of the hole 55.

The second rod segment 80 spans the ridgeguide cavity 25, and may have a diameter less than the diameter of the first rod segment 70. The third rod segment 85 extends only part of the way through the hole 60 and has a diameter that is slightly smaller than the diameter of the hole 60. The fourth rod segment 90 extends from the third rod segment 85, through the hole 60 and an appropriate distance out of the hole 60. The fourth rod segment 90 has a diameter that is less than the diameter of the third rod segment 85. An annular layer of RF absorbing material 95 (Emerson & Cummings MF-124 or MF-124-500 F) jackets the portion of the fourth rod segment 90 that lies within the hole 60. The outer diameter of the RF absorber jacket 97 is equal to the diameter of the hole 60.

A negative-resistance device 100 is disposed between the top surface 105 of the rod 65 and the surface 110 of the hole 55. The negative-resistance device may be an IMPATT diode, a TRAPATT diode, a BARITT diode, a GUNN diode, or any other similar negative resistance device.

A first adjustable tuning short 115 is inserted into one side of the ridgeguide cavity 25, as shown in FIGS. 1 and 2, so that one end of the tuning short 115 is disposed near the second segment 80 of the rod 65. A second adjustable tuning short 120 is inserted into the other side of the ridgeguide cavity 25, so that one end of the tuning short 120 is disposed near the impedance-matching step 45. Both tuning shorts 115 and 120 may be adjusted by sliding either short along the ridgeguide cavity 25.

The fourth segment 90 of rod 65 serves as an input lead for a DC bias signal. The source of the DC bias signal is connected to the fourth rod segment 90 by any appropriate electrical connector.

The above-described device is constructed entirely of brass or any other suitable conductive material, except for the dielectric jacket 75 and the RF absorber jacket 95.

In operation, microwave energy generated by the negative-resistance device 100 encounters a short at the top of the cylindrical cavity 55 forcing it to propagate through an impedance-matching transformer comprising the first rod segment 70 and the dielectric jacket 75. Upon reaching the ridgeguide cavity 25, the microwave energy encounters tuning short 115 and a filter network comprising the third rod segment 85, the fourth rod segment 90, and the RF absorber jacket 95. The microwave energy "sees" the filter network as a short-circuit and propagates along ridgeguide cavity 25 in the direction of the output port 30. When the microwave energy reaches the vicinity of impedance-matching step 45 and tuning short 120, it is coupled to the output port 30 and propagates out of the system to the load.

The foregoing description is intended to illustrate one particular embodiment of the invention. Those persons of ordinary skill in this art can devise modifications and other embodiments of the invention without departing from its principles.

What is claimed is:

1. A broadband microwave structure for efficiently coupling power from a solid-state power source to a load, including in combination:
    (a) a waveguide having top and bottom walls and tuning means at opposite ends thereof;
    (b) a coaxial output line, having an outer conductor connected to the top waveguide wall and an inner conductor connected to the bottom waveguide wall, for coupling power to a load;
    (c) an impedance-matching step integrally joined with said inner conductor of the coaxial output line and disposed between the top and bottom waveguide walls;
    (d) the top and bottom waveguide walls having aligned openings therein adjacent one of the tuning means; and
    (e) a frequency selective elongated oscillator module mounted in the aligned openings and electromagnetically coupled to the waveguide for coupling microwave power to the coaxial output line.

2. The apparatus defined in claim 1 wherein the oscillator module includes an elongated conductive member and a negative resistance device serially connected between the top waveguide wall and a source of DC bias current for causing the negative resistance device to propagate microwave power along the waveguide.

3. The apparatus defined in claim 2 wherein the frequency selective oscillator module further includes a filter means disposed at the opening in the bottom waveguide wall for selectively reflecting microwave power of a particular frequency into the waveguide and transmitting microwave power of all other frequencies to a means for absorbing microwave power.

4. A source of oscillating electromagnetic energy comprising:
    (a) a first waveguide shorted at the first end thereof and open at the second end thereof;
    (b) an energy-generating means disposed at the shorted first end of said first waveguide for generating microwave-frequency electromagnetic energy when said energy-generating means is excited by a DC bias current;
    (c) a second waveguide electromagnetically coupled to said first waveguide at a first coupling point between said energy-generating means and the open second end of said first waveguide wherein said second waveguide comprises:
        (1) a first tuning short disposed in said second waveguide at the end adjacent said first coupling point, and (2) a second tuning short disposed in said second waveguide at the end opposite said first coupling point;

(d) a conductive rod disposed coaxially within said first waveguide, with one end of said rod in electrical contact with said energy-generating means, and the other end of said rod extending out of said first waveguide and connected to a source of DC bias current wherein the portion of said rod between said energy-generating means and said first coupling point comprises:

(1) an impedance-matching transformer jacketed by a dielectric material;

(e) a filter network disposed between the open second end of said first waveguide and said first coupling point, said filter network comprising:

(1) a first filter means adjacent said first coupling point for reflecting electromagnetic energy of a desired frequency, f, to be output at said first coupling point and transmitting energy of all other frequencies, and (2) a second filter means disposed between said first filter means and the open second end of said first waveguide for absorbing electromagnetic energy; and (f) a third waveguide electromagnetically coupled to said second waveguide at a second coupling point between said second tuning short and said first coupling point.

5. The device of claim 4 wherein said second waveguide is a ridge waveguide having at least one ridge wall.

6. The device of claim 5 wherein said third waveguide is a coaxial transmission line having an inner conductor electrically connected to the ridge wall of said second waveguide, and an outer conductor electrically connected to the wall opposite the ridge wall.

7. A coaxially coupled tunable waveguide oscillator circuit comprising:

(a) a ridge waveguide in which a ridgeguide cavity is formed by a top wall and bottom wall;

(b) a first and a second tuning means disposed in opposite ends of said ridgeguide cavity;

(c) a cylindrical cavity coupled to said ridge waveguide adjacent said first tuning means, said cylindrical cavity extending orthogonally to said ridgeguide cavity;

(d) a frequency selective oscillator module coaxially disposed in said cylindrical cavity and electromagnetically coupled to said ridge waveguide whereby microwave energy is generated by said frequency selective oscillator module and coupled into said ridge waveguide;

(e) a coaxial output line having an outer and inner conductor, said coaxial output line connected to said ridge waveguide adjacent said second tuning means and extending orthogonally into said ridgeguide cavity wherein one end of said coaxial output line outer conductor and inner conductor are in electromagnetic contact with said top wall and bottom wall, respectively, and the opposite end of said coaxial output line is connected to a load, whereby said coaxial output line couples microwave energy out of said ridge waveguide to said load; and (f) an impedance-matching step mounted on said coaxial output line inner conductor within said ridgeguide cavity, whereby said impedance-matching step matches the impedance of said ridge waveguide with said load.

8. The oscillator circuit of claim 7 wherein the ridgeguide cavity is formed by a top and bottom wall, where at least one of said top and bottom walls is ridged.

* * * * *